United States Patent [19]

Kakuishi et al.

[11] Patent Number: 5,450,452
[45] Date of Patent: Sep. 12, 1995

[54] DIGITAL LOOP FILTER AND DIGITAL PLL CIRCUIT USING THE SAME

[75] Inventors: Mitsuo Kakuishi; Yutaka Awata, both of Kawasaki, Japan

[73] Assignee: Fujitsu Limited, Kanagawa, Japan

[21] Appl. No.: 25,555

[22] Filed: Mar. 3, 1993

[30] Foreign Application Priority Data

Mar. 3, 1992 [JP] Japan ................................. 4-045801

[51] Int. Cl.$^6$ ............................................. H03D 3/24
[52] U.S. Cl. ................................... 375/376; 375/371; 331/1 R; 327/159
[58] Field of Search ............................... 375/118, 120; 455/180.3, 280, 260; 331/1, 2; 364/724.01, 724.02; 307/510, 511

[56] References Cited

U.S. PATENT DOCUMENTS

| 4,780,759 | 10/1988 | Matsushima et al. | 375/120 X |
| 4,888,564 | 12/1989 | Ishigaki | 375/120 X |
| 4,920,474 | 11/1990 | Kennedy et al. | 375/120 X |

FOREIGN PATENT DOCUMENTS 61-501002  5/1986  Japan .

*Primary Examiner*—Stephen Chin
*Assistant Examiner*—Bryan E. Webster

[57] ABSTRACT

A digital loop filter includes a first loop filter for generating first phase control information at variable time intervals on the basis of phase error information indicating a phase difference between a first signal and a second signal. A second loop filter detects a frequency deviation between the first and second signals from the phase error information and generates second phase control information with a period inversely proportional to the frequency deviation. An adder generates finalized phase control information obtained by adding the first phase control information and the second phase control information to each other.

16 Claims, 14 Drawing Sheets

DIGITAL LOOP FILTER AND DIGITAL PLL CIRCUIT USING THE SAME

BACKGROUND OF THE INVENTION

1. Field of the Invention

The present invention generally relates to a digital loop filter suitable for a communications device that transfers digital data between a terminal device and an exchange office. More particularly, the present invention is concerned with a digital loop filter that generates phase control information necessary for a digital phase-locked loop (DPLL) circuit to synchronize, in digital form, a communications device at the user (subscriber) end having a master clock, such as a crystal oscillator, with a communications device provided at the exchange office and synchronized with a master clock signal for a network including the above communications devices.

2. Description of the Prior Art

Normally, it is required that communications devices that transfer digital data therebetween be synchronized with each other. For example, in a digital subscriber line transmission interface connecting a line terminating device provided on the exchange office side and a network terminating device provided on the user side, the line terminating device sends data to the network terminating device in synchronism with the master clock signal for the network.

FIG. 1 illustrates a PLL circuit provided in the user side. The PLL circuit is connected to a crystal oscillator OSC, and is made up of a phase comparator PC, a loop filter LF, and a frequency divider FD. Generally, a clock signal generated by the crystal oscillator OSC is out of phase with the master clock for the network. The PLL circuit functions to adjust the frequency of the clock signal generated by the crystal oscillator OSC in order to synchronize the clock signal with the master clock signal. The phase comparator PC compares the phase of a timing signal extracted from a signal sent by the office side device with the phase of a basic clock signal of the frequency divider FD, and generates a phase error information signal. The above timing signal is a repetitive frequency component.

The phase comparing operation is employed because the frequency of repetition of a data signal cannot be measured. Further, the phase of the timing signal may be different from that of the basic clock signal, even when the frequency of the timing signal is equal to that of the basic clock signal. The loop filter LF eliminates high-frequency components from the phase error signal output from the phase comparator PC. The frequency divider FD divides the frequency of the oscillator OSC in accordance with the phase error signal from the loop filter LF. In this manner, not only the phase error but also the frequency error can be corrected.

Normally, a frequency deviation of ±35 ppm (ppm=1/10$^6$) of the mater clock is allowed in the digital subscriber line transmission interface. The frequency deviation of the clock signal generated by the crystal oscillator OSC is equal to ±100 ppm. Hence, it is necessary for the PLL circuit to cope with a frequency deviation of ±135 ppm.

A PLL circuit may be analog or digital. In the analog PLL circuit, a part of the capacitance of the crystal oscillator is replaced by a voltage-controlled capacitor. The frequency of the output signal of the analog PLL circuit is adjusted by varying the voltage applied to the voltage-controlled capacitor. The above analog PLL circuit can handle the ±135 ppm frequency deviation when the voltage-controlled capacitor has a large enough capacitance. Further, the analog PLL circuit is capable of suppressing jitter based on a deviation of the sampling timing caused during the phase control operation because the amount of variation in the capacitance per cycle can be sufficiently reduced.

However, the analog PLL circuit is expensive because it needs the voltage-controlled capacitor. In addition, the analog PLL circuit is not suitable for digital systems.

The digital PLL circuit (DPLL) circuit uses a crystal oscillator oscillating at a constant frequency. The crystal oscillator can be formed by a crystal vibrator and an inverter formed on a chip on which the circuits of the user side network terminating device are formed. The crystal vibrator and one or two capacitors are externally connected to the chip on which the inverter which is the basic circuit of the crystal oscillator is formed. Hence, the total production cost of the digital PLL circuit is less than that of the analog PLL circuit.

However, in the above case, the crystal oscillator itself cannot compensate for the ±100 ppm frequency deviation of the crystal vibrator. Hence, it should be said that the crystal oscillator has a frequency deviation of ±100 ppm.

If the crystal vibrator is mounted on the chip, the frequency deviation of the crystal vibrator can be greatly compensated for, and the frequency deviation due to other causes, such as temperature variation and deterioration with age, will be approximately ±50 ppm.

However, in practice, it is desirable that the digital PLL circuit can control the frequency deviation of ±135 ppm taking into account the worst case. The conventional DPLL circuit has a large jitter for a large frequency deviation.

The above problem will now be described. First of all, the operation of the PLL circuit shown in FIG. 1 will be described in more detail. Normally, the frequency of the master clock equal to the oscillation frequency of the crystal oscillator OSC or half thereof is selected so as to be as high as possible above the frequency of the basic clock signal equal to the baud-rate frequency at which data is received. However, there is a limit regarding the operation speed of semiconductor elements forming the oscillator, and there is also a limit regarding the frequency of the master clock signal. In the digital subscriber line transmission interface, the frequency of the basic clock signal is 80 kHz, and the frequency of the master clock signal is 15.36 MHz. Hence, the basic clock signal is obtained by dividing the master clock by 192 by means of the frequency divider FD. In other words, one pulse of the basic clock signal is generated per 192 pulses of the master clock signal.

When it is necessary to advance the phase, the loop filter LF controls the frequency divider FD so that one pulse of the basic clock signal is generated when 191 consecutive pulses of the master clock signal are counted. When it is necessary to delay the phase, the loop filter LF controls the frequency divider FD so that one pulse of the basic clock signal is generated when 193 consecutive pulses of the master clock signal are counted.

As described above, the phase control (error) information from the loop filter LF indicates that the phase is to be advanced or delayed by a constant quantity or that the phase is not to be advanced or delayed. The interval between the consecutive pulses of the basic clock signal is decreased or increased by 1/15.36 MHz (=65 ns) when the phase is advanced or delayed. The time 65 ns is equal to 1/192 times the period of the basic clock signal equal to 1/80 kHz=12500 ns. Generally, a variation in the interval between the consecutive pulses of the basic clock signal is called jitter. When the frequency of the master clock signal is 15.36 MHz and the frequency of the basic clock signal is 80 kHz, a jitter of at least ±1/192 (=±0.005) may be caused.

The above jitter is increased due to the following causes. In the network terminating device at the user side in the digital subscriber line transmission interface, the basic clock signal is generated by dividing the frequency of the master clock signal generated by the crystal oscillator made up of crystal vibrator and the inverter formed in the LSI. Using the basic clock signal, the signal from the line terminating device at the exchange office side is received at the network terminating device. Phase information is extracted from the received signal, and is applied to the phase comparator PC.

FIG. 2 illustrates the relationship between the pre-cursor value in an isolated wave response characteristic and the timing phase. When the waveform of the received signal in the isolated wave response characteristic crosses the time axis within a threshold range around a pre-cursor value of 0, it is determined that the basic clock signal generated by the digital PLL circuit is in phase with the master clock signal for the network. In this case, the phase control is not performed. FIG. 2-(a) shows that basic clock signal is in phase with the master clock signal for the network. When the pre-cursor value has a positive value, as shown in FIG. 2-(b), it is determined that the operation timing of the network terminating device at the user side lags behind the operation timing of the line terminating device at the exchange office side. In this case, the phase of the basic timing signal is advanced. When the pre-cursor value has a negative value, as shown in FIG. 2-(c), it is determined that the operation timing of the network timing device at the user side leads that of the line terminating device at the exchange office side, and in this case the phase of the basic timing signal is delayed.

The pre-cursor value denoted as $C_{-1}$ indicates the amplitude of the received signal in the isolated wave response characteristic prior, by one cycle T, to the sampling time (main cursor) at which the maximum amplitude can be obtained. The pre-cursor value can be statistically calculated by the following equation:

$$C_{-1} = C_{-1} - \alpha \cdot sgn[e(n) \cdot a(n+1)] \quad (1)$$

where $a(n+1)$ is a decision symbol value which is the output signal of a decision feedback equalizer (an adaptive equalizer), $e(n)$ is an error, and $\alpha$ is a very small number called the step size.

The output signal of an adaptive equalizer as described above converges at the correct value for a long term, but it considerably deviates from the correct value for a short term. Hence, there is a possibility that it may be determined that the pre-cursor value exceeds the threshold range even though it does not exceed the threshold range. The phase control is then performed using incorrect data obtained by the statistical process, and hence jitter increases.

With the above in mind, a loop filter using an up/down counter as shown in FIG. 3 has been proposed.

The loop filter shown in FIG. 3 is intended to precisely generate phase control information from phase error information obtained by using the pre-cursor value. Phase error information output from the phase comparator (not shown in FIG. 3) consists of two bits, and is applied to the up/down counter CNT. When the phase error information indicates "advance", it increments the count value of the up/down counter CNT by +1. When the phase error information indicates "delay", it increments the count value of the up/down counter CNT by −1. When the phase error information indicates "in phase", it does not change the count value. When the count value of the up/down counter CNT reaches ±N (N is a positive integer), an overflow detection circuit ODT receiving the count value generates phase control information, and resets the up/down counter CNT. The system including the up/down counter CNT and the overflow detection circuit ODT is called random walk filter (RWF), which carries out an averaging process. As the number N increases, data averaged for a long term can be obtained, and hence the reliability of the phase control information increases.

The network terminating device must send a 192 kHz clock signal to terminals connected thereto. There is a standard which specifies that the magnitude of jitter of the 192 kHz clock signal must be equal to or less than 5% at peak-to-peak. The 192 kHz basic clock signal can be obtained by extracting one pulse every 80 pulses of the 15.36 MHz master clock signal. When the phase control is carried out, the basic clock signal can be obtained every 79 or 81 pulses of the 15.36 MHz master clock signal. The jitter of the basic clock signal for 80±1 is 2.5% at peak-to-peak. Further, the uncertainty of the phase error information is added to the 2.5% jitter. In this case, there is a large enough margin with respect to the tolerance of 5% defined in the standard. In order to reduce the uncertainty of the phase error information and satisfy the 5% tolerance, it is necessary to set the number N used in the up/down counter CNT to 128 or a similar value thereto.

However, when the number N is a large value equal to, for example, 128, the basic clock signal generated by the digital PLL circuit cannot be pulled into synchronization with the master clock signal for the network if there is a large frequency deviation. In the digital PLL circuit, there is no way to obtain synchronization other than the process for varying the interval between the consecutive pulses of the clock signal. Hence, the phase error can be corrected by varying the interval once. However, it is necessary to continuously perform the adjustment of the intervals between the consecutive pulses in order to correct the frequency deviation. The adjustment of the intervals between the consecutive pulses must be carried out more frequently as the frequency deviation increases. However, it is impossible to adjust the intervals more frequently than the number N of stages of the up/down counter CNT.

Assuming that the difference between the frequency of the clock signal in the line terminating device at the exchange office side and the frequency of the clock signal in the network terminating device at the subscriber side is Xppm, an increase in the deviation between the above clock signals for the period N=128 is obtained as follows:

192·X/1000000·N where the frequency of the master clock signal is 15.38 MHz and the frequency of the basic clock signal is 80 kHz.

When the frequency deviation is corrected by controlling the digital PLL circuit at intervals equal to N, the following equation is satisfied:

$$192 \cdot X / 1000000 \cdot N = 1$$

Hence, the following equation is obtained:

$$N = 5208.33/X \qquad (2)$$

When X=135 ppm, then N=38. When there is a frequency deviation of 135 ppm, it is necessary to perform the phase control every 38 pulses of the master clock signal. When N=128, only a frequency deviation equal to or less than approximately 40 ppm can be corrected.

In the case where the conventional digital PLL circuit is applied to the network terminating device in the digital subscriber line transmission interface, the standard regarding frequency deviation cannot be satisfied when the PLL circuit is designed to satisfy the standard regarding jitter. Further, the standard regarding jitter cannot be satisfied when the PLL circuit is designed to satisfy the standard regarding frequency deviation.

SUMMARY OF THE INVENTION

It is a general object of the present invention to provide a digital loop filter in which the above disadvantages are eliminated.

A more specific object of the present invention is to provide a digital loop filter capable of suppressing both the frequency deviation and jitter.

The above objects of the present invention are achieved by a digital loop filter comprising first loop filter means for generating first phase control information at a random period on the basis of phase error information indicating a phase difference between a first signal and a second signal; second loop filter means for detecting a frequency deviation between the first and second signals from the phase error information and for generating second phase control information at a period inversely proportional to the frequency deviation; and output means, coupled to the first and second loop filter means, for generating finalized phase control information obtained by adding the the first phase error information and the the second phase error information to each other.

Another object of the present invention is to provide a digital PLL circuit having the above-mentioned digital loop filter.

This object of the present invention is achieved by a digital PLL circuit comprising phase comparator means for comparing a phase of an input signal with a phase of an output signal and for generating phase error information; a digital loop filter generating finalized phase control information from the phase error information; oscillator means for generating an oscillation frequency; and frequency divider means, connected to the digital loop filter and the phase error signal, for dividing the oscillation frequency in accordance with the finalized phase control information and for generating the output signal. The digital loop filter comprises: first loop filter means for generating first phase control information at a random period on the basis of the phase error information; second loop filter means for detecting a frequency deviation between the input signal and the output signal from the phase error information and for generating second phase control information at a period inversely proportional to the frequency deviation; and output means, coupled to the first and second loop filter means, for generating finalized phase control information obtained by adding the first phase error information and the second phase error information to each other.

BRIEF DESCRIPTION OF THE DRAWINGS

Other objects, features and advantages of the present invention will become more apparent from the following detailed description when read in conjunction with the accompanying drawings, in which:

FIGS. 12(a-f) is a timing chart showing the operation of the constant-period loop filter shown in FIG. 11;

DESCRIPTION OF THE PREFERRED EMBODIMENTS

Figure 4:
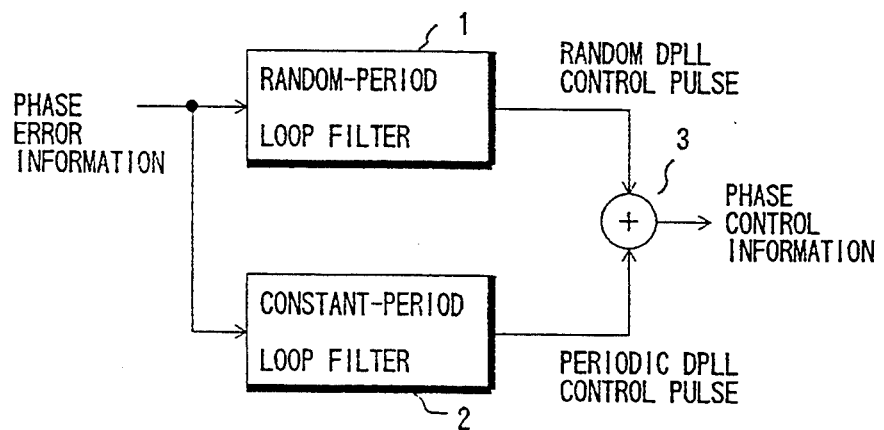
FIG. 4 is a block diagram showing an overview of a digital loop filter of the present invention.

FIG. 4 illustrates an overview of a digital loop filter of the present invention. The digital loop filter shown in FIG. 4 includes a random-period loop filter 1, a constant-period loop filter 2, and an adder 3. The random-period loop filter 1 generates phase control information at variable time intervals (the time intervals are not-constant) on the basis of phase error information from the digital PLL circuit (not shown). The constant-period loop filter 2 generates a phase control pulse signal periodically (at constant time intervals inversely proportional to the frequency deviation of the phase error information), and compensates for errors in the phase control information generated by the unit 1. The adder 3 adds the random DPLL control pulse signal from the unit 1 and the periodic DPLL control pulse signal from the unit 2 to each other, and generates finalized phase control information.

Figure 3:
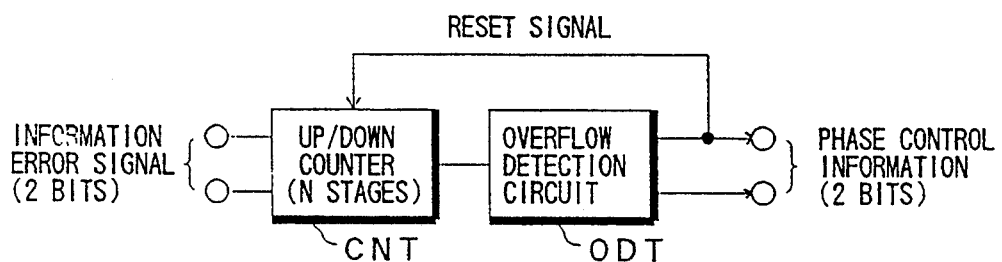
FIG. 3 is a block diagram of a conventional digital loop filter.

The random-period loop filter 1 operates in the same manner as the conventional loop filter shown in FIG. 3. The random DPLL control pulse signal from the unit 1 includes a first information indicating whether or not the phase should be varied, and a second information indicating whether the phase should be advanced or delayed.

The constant-period loop filter 2 periodically executes phase control and generates the periodic DPLL control pulse signal. When there is a large frequency deviation, the period of repetition of pulses of the periodic DPLL control pulse signal is reduced. When there is a small frequency deviation, the repetition period is increased or no control pulse signal is generated. If the frequency of the subscriber side terminal is lower than that of the network, the periodic DPLL control signal functions to advance the phase of the basic clock signal generated by the digital PLL circuit. If the frequency of the subscriber side terminal is higher than that of the network, the periodic DPLL control signal functions to delay the phase of the basic clock signal.

The above operation will now be described in more detail. Initially, the adder 3 receives only the phase control pulse signal (random DPLL control pulse signal) from the random-period loop filter 1. In this case, the finalized phase control information from the adder 3 is the random DPLL control pulse signal. When a frequency deviation occurs after a time, the constant-period loop filter 2 also generates the phase control pulse signal (periodic DPLL control pulse signal). The period of the periodic DPLL control pulse signal is inversely proportional to the frequency deviation. Hence, the period of the periodic DPLL control pulse signal is decreased with time. During this time, the random-period loop filter 1 continues to generate the random DPLL control pulse signal.

As the period of the periodic DPLL control pulse signal decreases, the basic clock frequency of the network terminating device at the subscriber side becomes close to and settles at the clock frequency of the network. In the stationary state in which there is a small frequency deviation, the constant period loop filter 2 plays the leading part in the stationary state in which there is a large frequency deviation.

When there is a small frequency deviation, the period of the periodic DPLL control pulse signal increases. In the stationary state, the number of phase control pulses from the constant-period loop filter 2 is not greater than the number of phase control pulses from the random-period loop filter 1.

In the above manner, the constant-period loop filter 2 periodically generates phase control pulses when there is a large frequency deviation. Hence, it is possible to set the number N of stages in the random-period loop filter 1 to a sufficiently large value. Hence, the uncertainty in the phase error information can be greatly reduced, so the existing standard regarding jitter can be satisfied.

Figure 5:
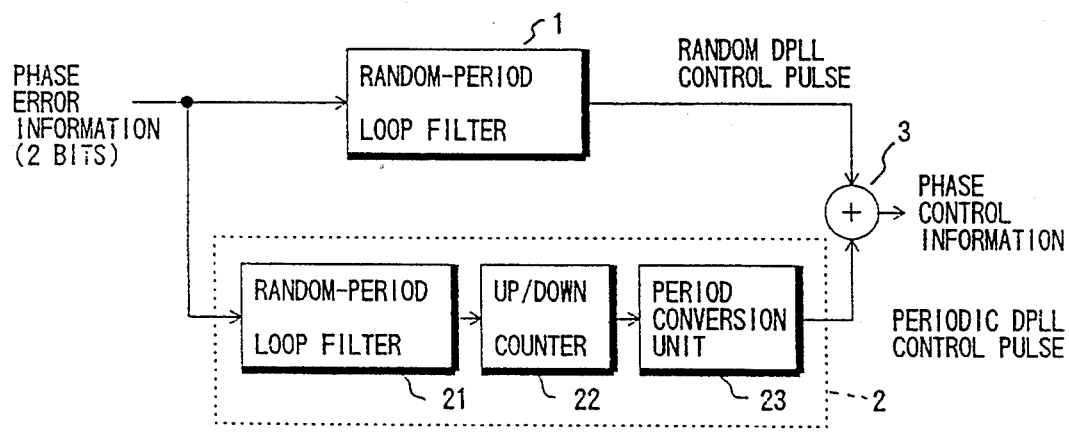
FIG. 5 is a block diagram of a digital loop filter according to a first embodiment of the present invention.

FIG. 5 is a block diagram of a first embodiment of the present invention. In FIG. 5, parts that are the same as parts shown in FIG. 4 are given the same reference numbers. The constant-period loop filter 1 is made up of a random-period loop filter 21, an up/down counter 22 and a period conversion unit 23.

Figure 1:
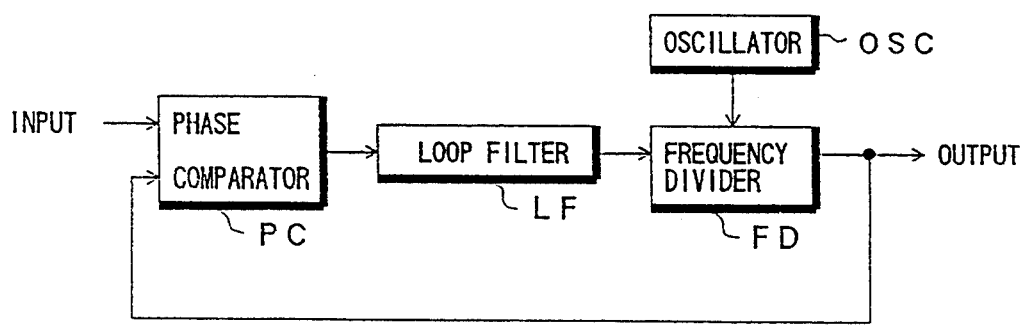
FIG. 1 is a block diagram of a conventional PLL circuit.
Figure 2:
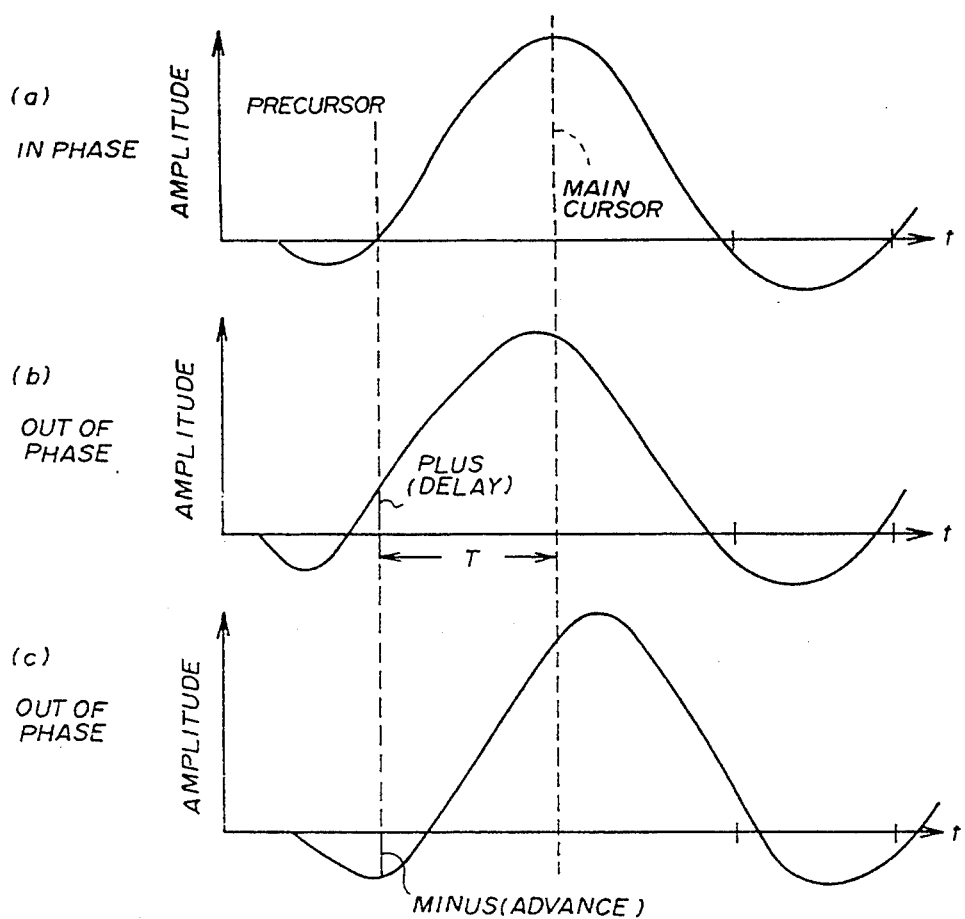
FIGS. 2(a-c) are a waveform diagram illustrating the relationship among the received signal waveform, the pre-cursor value and phase.

Phase error information is applied to the random-period loop filters 1 and 21. The phase error information can be generated by, for example, comparing the aforementioned pre-cursor value $C_{-1}$ from a decision feedback equalizer (which will be described later) with a threshold value THi ($>0$) by means of a unit corresponding to the phase comparator PC shown in FIG. 1. More particularly, the phase error information consists of two bits, which indicate one of the following three values:

+1 when $C_{-1} > +THi$
0 when $THi \geq C_{-1} \geq -THi$
−1 when $C_{-1} < -THi$.

The phase error information can be generated by other processes. For example, it is possible to refer to the timing of the main cursor at which the maximum amplitude of the received signal in the isolated response characteristic is obtained. It is important for the phase error signal to indicate information concerning advance, delay or in-phase.

The random-period loop filter unit 21 can be formed with an N-stage random walk filter as in the case of the loop filter shown in FIG. 3. That is, the phase error information is counted by the up/down counter CNT, which is reset by the overflow detection circuit ODT when the count value reaches $\pm N$. In this manner, phase control information is generated which includes a first piece (one bit) indicating whether or not phase control should be performed, and a second piece indicating whether the phase of the clock signal should be advanced ("0", for example) or delayed ("1", for example). For example, "11" indicates that the phase of the clock signal should be advanced, and "01" indicates that the phase thereof should be delayed. Further, "00" indicates that phase control should not be carried out.

The random-period loop filter 21 provided in the constant-period loop filter 2 includes an M-stage up/down counter where M is an integer greater than the number N. That is, the random-period loop filter 21 determines, for a long term (M>N), whether or not the basic clock signal is out of phase with the master clock signal for the network. When the count value of the random-period loop filter 21 reaches $\pm M$, it outputs $\pm 1$.

The output signal of the filter 21 is applied to the up/down counter 22 capable of counting the output signal within a count value range $\pm L$. The count value of the up/down counter 22 is applied to the period conversion unit 23, which converts the received count value into a corresponding period value. The period conversion unit 23 outputs the count value as the period value when the absolute value of the count value from the up/down counter 22 is equal to the period value. When the absolute value of the count value of the up/down counter 22 is different from the period value, the period value is produced so as to be inversely proportional to the absolute value of the count value of the up/down counter 22, and phase control pulses are generated at the period indicated by the period value. Information concerning whether the phase of the basic clock signal should be advanced or delayed is indicated by the sign of the counter value of the up/down counter 22.

The operation of the first embodiment of the present invention will be described in more detail.

In the initial state, the count value of the up/down counter 22 is reset to 0, and the corresponding period is infinite. Therefore, there is no output signal from the constant-periodic loop filter 2. If the frequency of the basic clock signal in the network terminating device at the subscriber side, in which the digital loop filter is provided, is lower than the clock frequency for the network, the phase error information input to the digital loop filter is such that pieces of data indicating +1 (advance) occur much more often than pieces of data indicating −1 (delay).

In the above case, the up/down counters CNT of the filters 1 and 21 will frequently reach their respective maximum values +N and +M. When the number M of stages of the filter 21 is set equal to four to eight times the number N of stages of the filter 1, and initially the up/down counter 22 is reset to 0, the filter 1 generates control pulses respectively indicating advance to the adder 3. After some time elapses, the random-period loop filter 21 starts to generate control pulses respectively indicating advance, and the up/down counter 22 starts to increase the count value toward +M. The period conversion unit 23 starts to generate the DPLL control pulses indicating advance at the period value corresponding to the count value of the up/down counter 22.

After a further time elapses, the up/down counter 22 indicates a further large count value, and the period conversion unit 23 generates DPLL control pulses at a reduced period inversely proportional to the count value. During that time, many DPLL control pulses are generated by the filter 1.

As the period of the DPLL control pulse signal decreases, the basic clock frequency of the subscriber side network terminating device becomes close to the clock frequency of the network. In this state, the number of pulses corresponding to the two-bit phase error information indicating advance is almost the same as the number of pulses corresponding to the phase error information indicating delay. Hence, the filters 1 and 21 stop generating the DPLL control pulses, and the up/down counter 22 indicates a constant count value. The digital loop filter enters a stationary state. In the stationary state in which there is a large frequency deviation, the constant-period loop filter 2 plays the leading part.

When there is a small frequency deviation, the absolute value of the count value of the up/down counter 22 is small, and the period of the DPLL pulse signal from the period conversion unit 23 is large. Then, the number of pulses corresponding to the phase error information indicating advance is approximately equal to the number of pulses indicating delays, and the digital loop filter is settled in this state. In this case, the number of pulses of the phase control pulse signal from the constant-period loop filter 2 is not greater than the number of pulses of the phase control pulse signal from the random-period loop filter 1 even when the loop filter shown in FIG. 5 is settled in the stationary state. If the frequency deviation becomes 0, only the process for pulling the phase of the basic clock signal in synchronization with the master clock signal for the network is required, and hence only the filter 1 operates.

As described above, when there is a large frequency deviation, the constant-period loop filter 2 periodically generates the DPLL control pulses. Hence, it is possible to increase the number N of filter stages of the random-period loop filter 1 and greatly reduce the uncertainty in the phase error signal.

Figure 6:
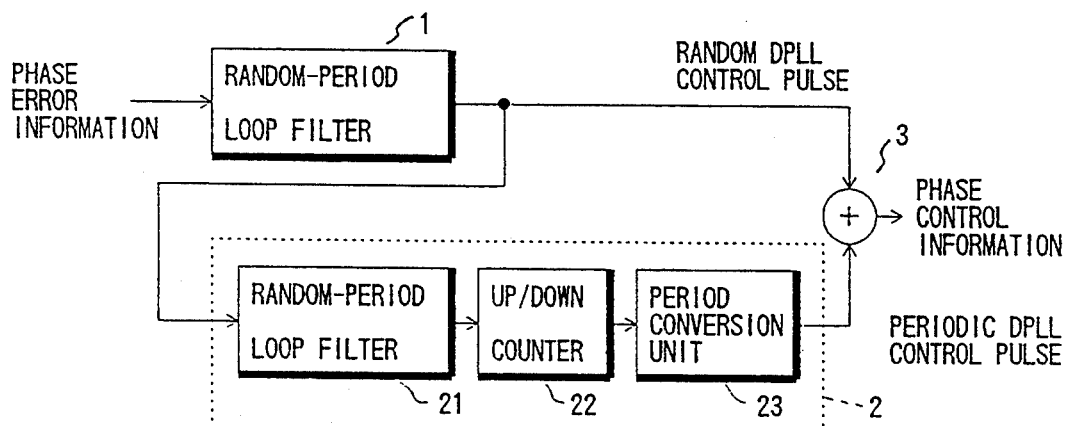
FIG. 6 is a block diagram of a digital loop filter according to a second embodiment of the present invention.

FIG. 6 shows a digital loop filter according to a second embodiment of the present invention. In FIG. 6, parts that are the same as parts shown in the previously described figures are given the same reference numbers. The random-period loop filter 1 shown in FIG. 6 functions as a part of the random-period loop filter 21 shown in FIG. 5. That is, as shown in FIG. 6, the output terminal of the random-period loop filter 1 is connected to the random-period loop filter 21. Hence, the number of stages of the random-period loop filter 21 shown in FIG. 6 can be reduced to M' (<M). For example, M' is equal to 4 to 8.

The phase error information is applied to the random-period loop filter 1, which generates many +1 or −1 signals if there is a frequency deviation. The above frequency deviation is input to the random-period loop filter 21. When the frequency deviation is continuously present, the filter 21 reaches ±M', and increases the count value of the up/down counter 22. The other structural elements and operations are the same as those of the first embodiment of the present invention.

The first embodiment of the present invention shown in FIG. 5 needs a long-term decision in order to detect a frequency deviation since the random-period loop filter 21 directly receives the phase error signal. Hence, it is necessary to set the number M of stages of the filter 21 shown in FIG. 5 equal to four to eight times the number N of stages of the filter 1. For example, the number M of stages of the filter 21 shown in FIG. 5 is 512 to 1024. In practice, the filter 21 is formed with an up/down counter. When the number M of stages of the filter 21 shown in FIG. 5 is 1024, a 12-bit up/down counter is needed to form the filter 21, taking into account the sign bit. In contrast, the eight-stage filter 21 shown in FIG. 6 can be formed with a five-bit up/down counter, even taking into account the sign bit. Hence, a circuit corresponding to seven stages can be eliminated according to the second embodiment of the present invention.

A description will now be given of the operation of the second embodiment of the present invention when there is a frequency deviation of +72 ppm. It will now be assumed that the initial conditions are that the count value of the up/down counter 22 is 0 and there is no output pulse from the constant-period loop filter 2. The phase error information is applied to the random-period loop filter 1 shown in FIG. 6 with the above initial conditions. When there is a frequency deviation of +72 ppm, the phase error information indicating a positive value (+1) is applied to the filter 1. The filter 1 outputs to the adder 3 the random DPLL control pulse signal indicating the result of accumulating the values indicated by the phase error information. The output signal of the filter 1 shown in FIG. 6 is also the input signal of the random-period loop filter 21. When there is a frequency deviation, the filter 21 starts to generate an output signal, which changes the count value of the up/down counter 22. A change in the count value of the up/down counter 22 changes the period of the periodic DPLL control pulse signal output by the period conversion unit 23 (the interval between consecutive pulses). When the period of the pulse signal from the unit 23 reaches "72" corresponding to the frequency deviation 72 ppm, the frequency deviation can be completely corrected by the DPLL control pulse signal and the phase control information output from the adder 3 does not have any frequency deviation.

Table 1 shows the relationship between frequency deviation and the period of the DPLL control pulse signal from the filter unit 2 shown in FIG. 6.

TABLE 1

| Count value | Frequency deviation | Period | Count value | Frequency deviation | Period |
|---|---|---|---|---|---|
| 0 | 0 | infinite | 16 | 72 | 72 |
| 1 | 4.5 | 1157 | 17 | 76.5 | 68 |
| 2 | 9 | 579 | 18 | 81 | 64 |
| 3 | 13.5 | 386 | 19 | 85.5 | 61 |
| 4 | 18 | 289 | 20 | 90 | 58 |
| 5 | 22.5 | 231 | 21 | 94.5 | 55 |
| 6 | 27 | 193 | 22 | 99 | 53 |
| 7 | 31.5 | 165 | 23 | 103.5 | 50 |
| 8 | 36 | 145 | 24 | 108 | 48 |
| 9 | 40.5 | 129 | 25 | 112.5 | 46 |
| 10 | 45 | 116 | 26 | 117 | 45 |
| 11 | 49.5 | 105 | 27 | 121.5 | 43 |
| 12 | 54 | 96 | 28 | 126 | 41 |
| 13 | 58.5 | 89 | 29 | 130.5 | 40 |
| 14 | 63 | 83 | 30 | 135 | 39 |
| 15 | 67.5 | 77 | | | |

When the frequency deviation has been corrected, the phase error signal is absent, and the digital loop filter shown in FIG. 6 enters the stationary state. When the digital loop filter shown in FIG. 6 receives the phase error signal indicating a frequency deviation of +72 ppm and enters the stationary state, it can be seen from Table 1 that the count value of the up/down counter 22 is 16 and the period of the DPLL control pulse signal (the interval between the consecutive pulses thereof) is equal to 72. It should be noted that the digital loop filter is maintained in the stationary state in the state in which the period of the DPLL control pulse signal from the unit 2 is equal to 72. If the period of the DPLL control pulse signal from the unit 2 is 72 when the count value of the up/down counter 22 is 10, a frequency deviation of 72 ppm is completely corrected with the count value equal to 10. In this case, the number of pulses corresponding to the phase error information indicating +1 is almost the same as that of pulses corresponding to the phase error information indicating −1, and the accumulated value is approximately zero. At this time, the digital loop filter is in the stationary state.

In order to describe the operation of the second embodiment of the present invention in more detail, it will now be assumed that the random-period loop filter 1 is a random walk filter formed with a seven-stage up/down counter, and the random-period loop filter 21 is a random walk filter formed with a three-stage up/down counter. In this case, when 128 the phase error signals respectively indicating +1 or −1 are applied to the digital loop filter shown in FIG. 6, the random-period loop filter 1 generates a one-shot pulse indicating +1 or −1. When eight pulses respectively indicating the same value (+1 or −1) are output from the filter 1, the filter 21 generates a one-shot pulse indicating +1 or −1, and the count value of the up/down counter 22 changes by 1. As a result, when the accumulated value of the output signal of the filter 21 indicates +8 or −8, the count value of the up/down counter 22 changes by 1.

The random-period loop filter 21 is provided to remove slight variations in the phase error signal. As the number of stages of the filter 21 increases, variations over a longer term can be removed. The output signal of the filter 1 is used as the DPLL control pulse signal and the three-stage up/down counter is used to form the random-period loop filter 21, so that the filter 2 can cope with a longer-term change in the phase error signal than the filter 1.

The filter 1 may sometimes generate the pulse signal for advancing or delaying the phase in order to cope with a short-term frequency deviation even after the digital loop filter enters the stationary state. In this case, the accumulated value output by the cascaded circuit made up of the filters 1 and 21 is zero for the long term. Hence, an output signal of the filter 21 is not produced in the above case.

In practice, taking into consideration the fact that the filter 21 is formed with an up/down counter, the filter 21 can be included in the up/down counter 22. If the filter 21 formed with a three-stage up/down counter is included in the up/down counter 22, the values shown in the column indicating the count value in Table 1 can be modified so that 0–7 are substituted for count value 0 shown in Table 1 and 8–15 are substituted for count value 1, and so on.

Figure 7:
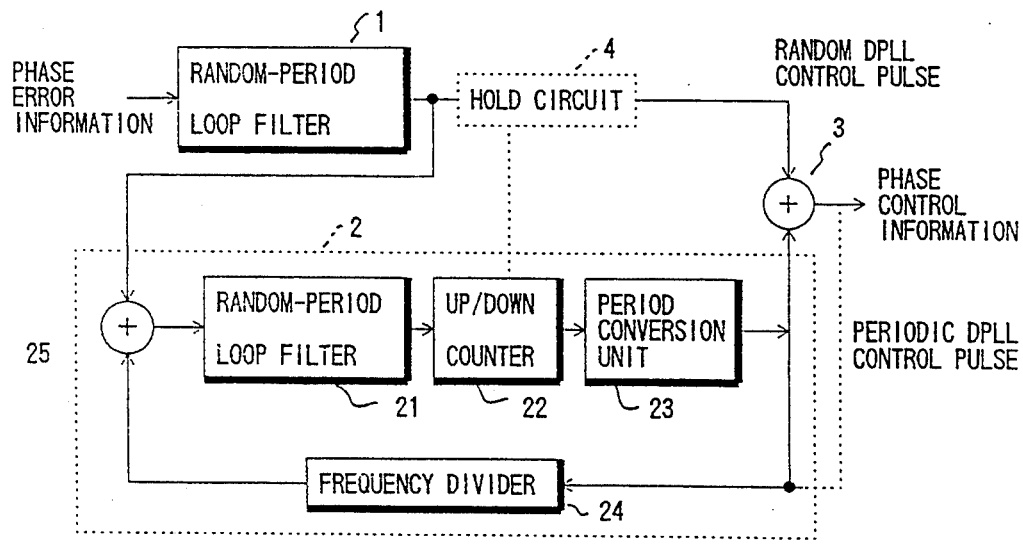
FIG. 7 is a block diagram of a digital loop filter according to a third embodiment of the present invention.

FIG. 7 shows a digital loop filter according to a third embodiment of the present invention. The digital loop filter shown in FIG. 7 is configured by adding a frequency divider 24 and an adder (OR circuit) 25 to the digital loop filter 2 shown in FIG. 8. The periodic DPLL control pulse signal output from the period conversion unit 23 is fed back to the random-period loop filter 21 via the frequency divider 24 and the adder 25 in order to reduce the circuit scale of the period conversion unit 23.

A description will now be given of the operation of the third embodiment of the present invention performed when there is a frequency deviation of +72 ppm. It will now be assumed that the filter 21 shown in FIG. 7 has eight stages and the frequency divider 24 has a frequency dividing ratio equal to 8. In this case, when the period of the DPLL control pulse signal from the period conversion unit 23 is 72 (see Table 1), a pulse based on the DPLL control pulse signal is applied to the up/down counter 22 once per 4608 periods (=8×8×72). The input signal of the random-period loop filter 21 from the frequency divider 24 is controlled so that the above input signal is negative (−1) when the count value of the up/down counter 22 is +16 (positive) and is positive (+1) when the count value of the up/down counter 22 is −16 (negative). By the above control, the count value of the up/down counter 22 is changed so that the absolute value of the count value decreases. For example, if the count value of the up/down counter 22 decreases from 16 to 15, the period of the DPLL control pulse signal from the period conversion unit 23 changes to 77 (see Table 1). That is, the DPLL control pulse is generated every 77 periods, and the number of DPLL control pulses per unit time is decreased. Hence, the 72 ppm frequency deviation is no longer under control.

If the number of DPLL control pulses per unit time is insufficient, a frequency deviation will occur again, and the average value of the phase error signals (the accumulated value thereof) is not zero. Hence, a signal is output from the random-period loop filter 1. The output signal of the filter 1, that is, the DPLL control pulse signal is added to the DPLL control pulse signal from the filter 2.

The interval x between the DPLL control pulses from the filter 1 (the period of the DPLL control pulse signal therefrom) can be calculated using the following equation taking into account the number of DPLL control pulses per period:

$$1/72 = 1/77 + 1/x \tag{3}$$

Hence, x=1109. That is, when the positive pulse (+1) is generated by the unit 1 once per 1109 periods, the finalized DPLL pulse from the adder is generated once per 72 periods.

The output signal of the filter 1 is an input signal of the filter 21. Hence, in the case where the filter 21 is formed with an eight-stage up/down counter, the count value of the up/down counter 22 changes by 1 when the accumulated value of the output signal of the filter 1 reaches 8. If one pulse of the pulse signal from the filter 21 is generated per 1109 periods, the up/down counter 22 increments its count value by one per 8872 (=1109×8) periods.

However, the up/down counter 22 is controlled by the feedback circuit including the frequency divider 24 so that the count value thereof decreases by 1 every 4608 periods. Hence, the count value of the up/down counter 22 is changed so that the absolute value thereof further decreases and is changed from 15 to 14.

When the count value of the up/down counter 22 becomes equal to 14, the period of the DPLL control pulse signal from the filter 2 becomes equal to 83, and the period of the DPLL control pulse signal from the filter 1 becomes equal to 542 (1/72=1/83+1/x). Hence, the interval between pulses applied to the up/down counter becomes equal to 4336 (542×8), which is approximately equal to the pulse interval (period) of pulses (=4608 periods) applied to the up/down counter 22 via the frequency divider 24.

In order to simplify the above explanation, the period of the pulse signal from the filter 2 before the balanced state is broken was used to compute the period of the pulse signal from the filter 1. In practice, it is necessary to use the period obtained after the digital loop filter reaches the new balanced state.

The above operation will now be quantitatively given using equations. It will now be assumed that the period of the DPLL control pulse signal obtained by inserting the frequency deviation into the equation (2) is n, the period of the pulse signal from the filter 2 after the digital loop filter shown in FIG. 7 reaches the stationary state is np, and the average period of the pulse signal from the filter 1 is nr. In the stationary state, the following equations hold. First of all, the following equation (4) should hold because the necessary number of pulses is obtained, at the output terminal of the adder 3 shown in FIG. 7, from the control pulses from the random-period loop filter 1 and the control pulses from the constant-period loop filter 2:

$$1/n = 1/np + 1/nr \tag{4}$$

Further, the average value at the input terminal of the up/down counter 22 must be zero. Hence, the following equation (5) is obtained applying the above fact to the input terminal of the random-period loop filter 21:

$$1/np/8 - 1/nr = 0 \tag{5}$$

From the equations (4) and (5), the following equations can be obtained:

$$np = n \cdot 9/8 \tag{6}$$

$$nr = n \cdot 9 \tag{7}$$

With respect to supply of DPLL control pulses necessary to cope with a frequency deviation, it can be seen from the equations (6) and (7) that 8/9 of the necessary number of pulses per period are supplied from the constant-period loop filter 2 and 1/9 thereof is supplied from the random-period loop filter 1 when the frequency dividing ratio of the frequency divider 24 is equal to 8.

The frequency dividing ratio 8 is used in the equations (6) and (7). If the frequency dividing ratio 8 is infinite, then nr=0 and np=n. This corresponds to the second embodiment of the present invention.

Supplying of 1/9 of the necessary number of pulses per period from the random-period loop filter 1 when there is a somewhat large frequency deviation means outputting of pulses from the filter 1 (with the same value as those from the filter 2) at a small period (equal to 648 in the case being considered). Hence, it becomes possible to eliminate the number of pulses having, due to uncertainty in the phase error information, a value different to those from the filter 2.

The reason for the above is as follows. In the case where the phase control with respect to a frequency error is mainly carried out by the constant-period loop filter as in the case of the first and second embodiments of the present invention, the random-period loop filter generates few phase control pulses in the balanced state. In this state, if a short-term uncertainty of the phase error information occurs, the random-period loop filter responds to the above short-term uncertainty, and generates pulses each indicating +1 or −1. In contrast, according to the third embodiment of the present invention in which the phase control with respect to frequency error is partially performed by the random-period loop filter, all the phase control pulses indicate the same sign (either +1 or −1) in the balancing state. This is because phase control pulses each indicating the values (−1 or +1) different from the values (+1 or −1) of the pulses generated in the balancing state are not generated. As a result, according to the third embodiment of the present invention, all the phase control pulses indicate the same sign as each other, and jitter can be further reduced as compared with the first and second embodiments of the present invention.

When there is a small frequency deviation, the term nr obtainable from the equation (7) is large, and the number of DPLL control pulses per one period is not great so as to suppress the uncertainty. However, even in the above case, the term np has a large value, and the interval between the consecutive DPLL control pulses is sufficiently large. Even if the DPLL control pulses indicating +1 and the DPLL control pulses indicating −1 are generated, it is possible to sufficiently suppress jitter.

It can be seen from the above that the pulses from the frequency divider 24 are periodic, not random. Hence, it is not necessary to apply the pulses from the frequency divider 24 to the random-period loop filter 21. In the above-mentioned example, it is possible to use a six-stage frequency divider (64 dividing ratio) rather than the three-stage frequency divider. Thereby, it is possible to directly apply the pulses from the frequency divider 24 to the up/down counter 22.

As has been described previously, when the master clock frequency is 192 times the basic clock frequency, the magnitude of jitter is approximately 0.5% (=1/192). If both +1 pulses and −1 pulses are used, a jitter of approximately 1% will occur even if the consecutive pulses are sufficiently far away from each other (the period or interval of the DPLL control pulse signal is sufficiently large). The third embodiment of the present invention utilizes either pulses respectively all +1 or pulses respectively all −1. Hence, jitter caused in the third embodiment is less than that caused in the first or second embodiment. In practice, if there is uncertainty in the phase error information due to the pre-cursor value, there is slightly larger jitter. Even under the above conditions, the third embodiment of the present invention is capable of improving the jitter characteristic by approximately 0.5%.

If the third embodiment allows jitter as large as the first or second embodiment, it becomes possible to simplify the relationship shown in Table 1. That is, the following Table 2 can replace Table 1. In Table 2, 16 count values are defined and the maximum period of the DPLL control pulse signal can be set to 512, close to 579. Hence, it is sufficient to implement a 4-to-9 bit conversion process, and the hardware structure thereof can be made up of approximately 50 gates, and reduced to approximately one third of the size of the hardware structure that dow not allow jitter as large as the first or second embodiment.

TABLE 2

| Count value | Frequency deviation | Period |
|---|---|---|
| 0 | 0 | infinite |
| 1 | 9 | 579 |
| 2 | 18 | 289 |
| 3 | 27 | 193 |
| 4 | 18 | 289 |
| 5 | 36 | 145 |
| 6 | 45 | 116 |
| 7 | 54 | 96 |
| 8 | 63 | 83 |
| 9 | 72 | 72 |
| 10 | 81 | 64 |
| 11 | 90 | 58 |
| 12 | 99 | 53 |
| 13 | 108 | 48 |
| 14 | 117 | 45 |
| 15 | 126 | 41 |

In order to improve the jitter characteristic, it is also important to sufficiently separate the adjacent DPLL pulses from each other in time. When jitter is 0.5%, the consecutive DPLL pulses are separated from each other by over 20 pulses of the basic clock signal.

With the above in mind, a hold circuit 4 depicted by the broken line in FIG. 7 can be used. The hold circuit 4 is provided between the random-period loop filter 1 and the adder 3. The hold circuit 4 holds the DPLL control pulse signal generated by the filter 1 when the count value of the up/down counter forming the filter 1 reaches ±N until the hold circuit 4 receives a control signal from the up/down counter 22. The above control signal is generated at approximately the half-way point of cycle in which the DPLL control pulse signal is periodically generated from the constant-period loop filter 2. The DPLL control pulse signal is cleared in the hold circuit 4 immediately after it is output to the adder 3.

Use of the hold circuit 4 leads to an increase in the distance between consecutive DPLL control pulses. As shown in Table 3, the distance between consecutive DPLL control pulses corresponds to at least 26 pulses of the basic clock signal. Hence, it is possible to prevent an increase in jitter caused when consecutive DPLL pulses are close to each other.

TABLE 3

| Count value | Frequency deviation | Period |
|---|---|---|
| 0 | 0 | infinite |
| 1 | 7 | 781 |
| 2 | 13 | 391 |
| 3 | 20 | 260 |
| 4 | 27 | 193 |
| 5 | 33 | 158 |
| 6 | 40 | 130 |
| 7 | 47 | 111 |
| 8 | 53 | 98 |
| 9 | 60 | 87 |
| 10 | 67 | 78 |
| 11 | 73 | 71 |
| 12 | 80 | 65 |
| 13 | 87 | 60 |
| 14 | 93 | 56 |
| 15 | 100 | 52 |

If the timing of outputting the random DPLL control pulse signal held in the hold circuit 4 is limited to the half of the period of the periodic DPLL control pulse signal from the filter 2, a slight problem will occur when the period is long. For example, when the period is 781, the outputting of the random DPLL control pulse signal is delayed by 780 cycles at most. In this case, jitter can be reduced whereas the phase cannot be corrected.

If the period is long, a hold circuit can be used which holds the random DPLL control pulse signal and outputs it at a time at which the consecutive DPLL pulses are sufficiently separated from each other. For example, when the period is equal to or greater than 600, the random DPLL control pulse signal is output from the hold circuit 4 at one of three evenly distributed points obtained by equally dividing up the period of the periodic DPLL control pulse signal from the filter 2. Alternatively, it is also possible to output the random DPLL control pulse signal during a period before or after the timing of inputting or outputting of the periodic DPLL control pulse signal (for example, 100 cycles of the periodic DPLL control pulse signal after inputting or outputting thereof).

A variation of the configuration shown in FIG. 7 can be made in which the phase control information from the adder 3 is applied to the frequency divider 24. In this case, the equation (5) can be modified as follows:

$$1/n8 - 1/nr = 0$$

Using the above equation and the aforementioned equation (4), the equations (6) and (7) described previously can be changed as follows:

$$np = n \cdot 8/7$$

$$nr = n \cdot 8$$

It can be seen from the above two equations that $\frac{7}{8}$ of the total number of DPLL control pulse signals necessary to correct frequency deviation per period are supplied from the constant-period loop filter 2 and $\frac{1}{8}$ thereof is supplied from the random-period loop filter 1 when the frequency dividing ratio of the frequency divider 24 is equal to 8.

Figure 8:
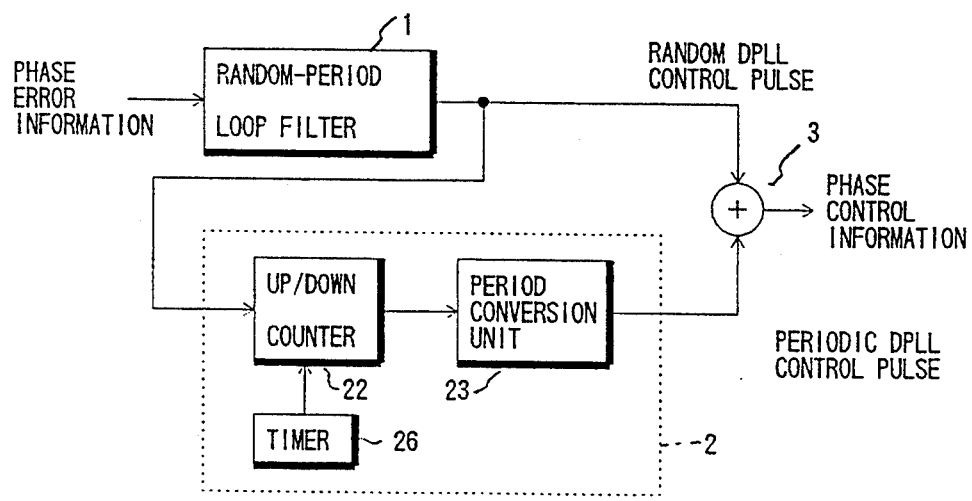
FIG. 8 is a block diagram of a digital loop filter according to a fourth embodiment of the present invention.

FIG. 8 is a block diagram of a digital loop filter according to a fourth embodiment of the present invention. The random-period loop filter 2 used in the second embodiment shown in FIG. 6 is removed therefrom in order to directly apply the random DPLL control pulse from the filter 1 to the up/down counter 22, and a timer 26 is connected to the up/down counter 22.

According to the first, second and third embodiments of the present invention, initially, the random-period loop filter 1 is used for the DPLL control, and thereafter some of the DPLL control pulses generated by the filter 1 are replaced by the DPLL control pulses generated by the constant-period loop filter 2 in accordance with the number of random DPLL pulses from the filter 1. When no DPLL control pulse is output from the filter 1, the digital loop filter is maintained in the balanced state.

According to the fourth embodiment of the present invention, a unit time is defined by the timer 26. The up/down counter 22 counts random DPLL control pulses which are received from the filter 1 for the unit time. The period conversion unit 23 determines the period of the periodic DPLL control pulse signal on the basis of the count value of the up/down counter 22.

Assuming that the unit time defined by the timer 26 corresponds to 2048 cycles of the basic clock signal, the up/down counter 2 counts DPLL control pulses from the filter 1 for a period equal to 2048 cycles. In the initial state, the number of stages of the filter 1 is not set to a large value such as 128, but to a small value such as 8 or 16. Thereby, the frequency deviation can be followed even by the random DPLL control pulse signal from the filter 1 alone.

The relationship between the number of random DPLL control pulses and the frequency deviation for the timer period equal to 2640 cycles of the basic clock signal is as shown in Table 4:

TABLE 4

| Number of pulses | Frequency deviation | Period A | Period B |
|---|---|---|---|
| 0 | 0 | infinite | infinite |
| 4 | 8 | 651 | 781 |
| 8 | 16 | 325 | 391 |
| 12 | 24 | 217 | 260 |
| 16 | 32 | 163 | 193 |
| 20 | 39 | 134 | 168 |
| 24 | 47 | 111 | 130 |
| 28 | 55 | 95 | 111 |
| 32 | 63 | 83 | 98 |
| 36 | 71 | 73 | 87 |
| 40 | 79 | 66 | 78 |
| 44 | 87 | 60 | 71 |
| 48 | 95 | 55 | 65 |
| 52 | 103 | 51 | 60 |
| 56 | 110 | 47 | 56 |
| 60 | 118 | 44 | 52 |

The period of the periodic DPLL control pulse signal from the filter 2 with respect to the frequency deviation is indicated by period A in Table 4. When the periodic DPLL control pulse signal is generated with the period A, it becomes possible to make the output signal of the random-period loop filter 1 equal to zero. In this case, +1 pulses and −1 pulses will be generated as in the case of the third embodiment of the present invention. This is not advantageous when the jitter characteristic is to be improved.

In such a case, the period B in Table 4 is used instead of the period A. The period B is the same as that defined in Table 3, and is approximately 1.2 times larger than the period A. The period B corresponds to 3168 cycles of the basic clock signal (1.2×2640), and is the same as the period in the left-hand column of Table 3.

The number of random DPLL control pulses is counted for the period equal to 3168 cycles of the basic clock signal, and the corresponding period B defined in Table 4 provided in the period conversion unit 23 is read by using the number of random DPLL control pulses. In this case, the number of periodic DPLL control pulses obtained for the above period is insufficient to correct the corresponding frequency deviation, and random DPLL control pulses compensating for the above insufficiency are generated from the random-period loop filter 1. The random DPLL control pulses compensating for the insufficiency have the same sign as the periodic DPLL control pulses from the filter 2.

It is possible to apply the hold circuit 4 shown in FIG. 7 to the configuration shown in FIG. 8. In the aforementioned first through fourth embodiments of the present invention, the master clock frequency is 15.36 MHz and the basic clock frequency is 80 kHz. However, the present invention is not limited to these frequencies. Further, the present invention is not limited to the parameter values shown in Tables 1 to 4.

Figure 9:
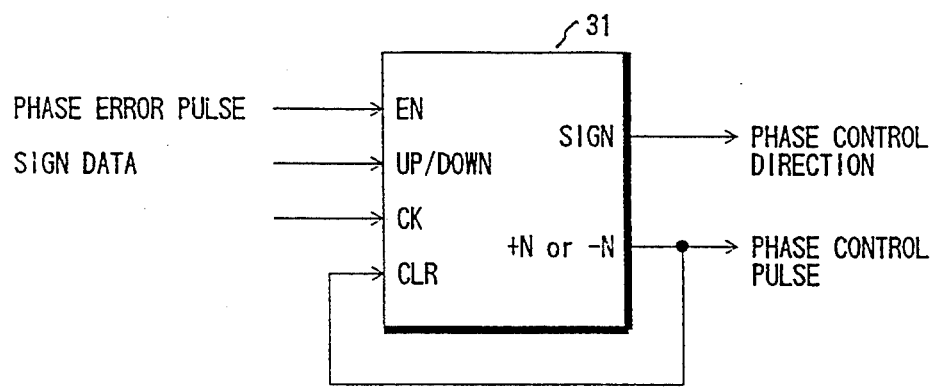
FIG. 9 is a block diagram of a random-period loop filter used in the embodiments of the present invention.

FIG. 9 is a block diagram of the random-period loop filter 1 used in the previously described embodiments of the present invention. The random-period loop filter 1 includes an up/down counter 31, which has an enable terminal EN, an up/down instruction terminal UP/DOWN, a clock terminal CK, a clear terminal CLR, a sign terminal SIGN and a phase control instruction terminal labeled +N or −N. The up/down counter 31 operates in synchronism with a clock signal (FIG. 10(d)) applied to the clock terminal CK.

Figure 10:
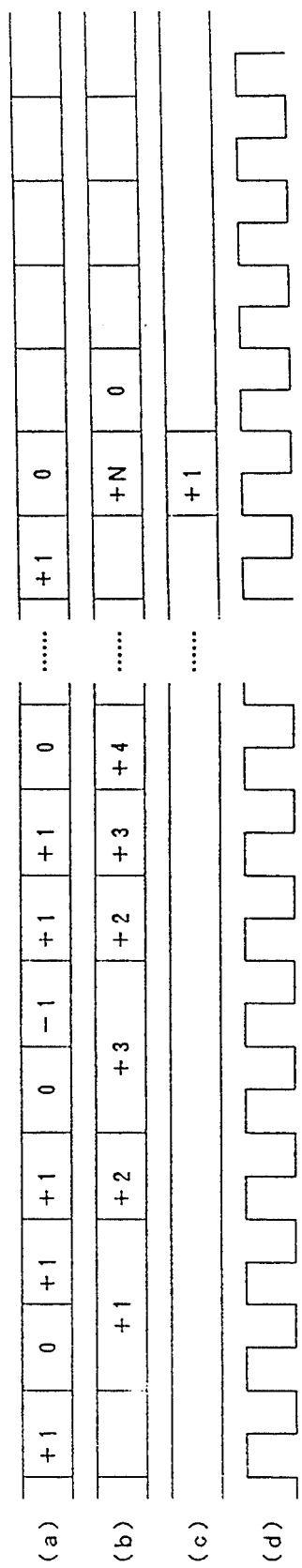
FIGS. 10(a-d) is a timing chart showing the operation of the random-period loop filter shown in FIG. 9.

As has been described previously, the phase error information is +1, −1 or 0. The absolute value of the phase error information is applied to the enable signal EN, and data indicating the sign thereof is applied to the up/down instruction terminal UP/DOWN. The clock signal is applied to the clock terminal CK. In synchronism with the clock signal, the phase error information is applied to the up/down counter 31, as shown in FIG. 10(a).

The random DPLL control pulse signal contains data indicating a phase control direction (plus or minus), and a phase control pulse. The data indicating the phase control direction and the phase control pulse form the aforementioned phase control information. As shown in FIG. 10(b), the up/down counter 31 accumulates the phase error information, and the count value thereof changes. When the count value of the up/down counter 31 reaches N or −N, the up/down counter 31 generates the phase control signal, as shown in FIG. 10(c).

Figure 11:
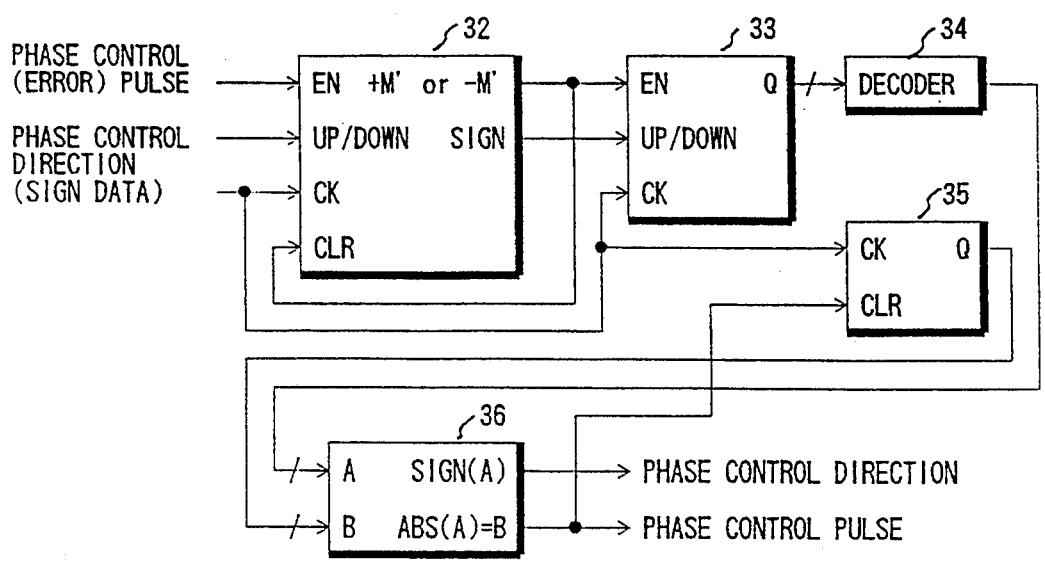
FIG. 11 is a block diagram of a constant-period loop filter used in the first or second embodiment of the present invention.

FIG. 11 is a block diagram of the constant-period loop filter 2 used in the aforementioned embodiments of the present invention. The constant-period loop filter 2 is made up of two up/down counters 32 and 33, a decoder 34, a counter 35 and a comparator 36. The up/down counter 32 corresponds to the random-period loop filter 21, and the up/down counter 33 corresponds to the up/down counter 22. The decoder 34, the counter 35 and the comparator 36 correspond to the period conversion unit 23.

The up/down counter 32 has an enable terminal EN, an up/down instruction terminal UP/DOWN, a clock terminal CL, a clear terminal CLR, a phase control instruction terminal labeled +M' or −M' (in the case of the second embodiment), and a sign terminal SIGN. In the first embodiment of the present invention, the phase control instruction terminal is labeled +M or −M. The up/down counter 33 has an enable terminal EN, an up/down instruction terminal UP/DOWN, a clock terminal CK, and an output terminal Q.

In the second embodiment of the present invention, the enable terminal EN and the up/down instruction terminal UP/DOWN of the counter 32 receive data indicating the phase control direction and the phase control pulse from the up/down counter 31 shown in FIG. 9. That is, the sign terminal and the phase control instruction terminal +N or −N are respectively connected to the up/down instruction terminal UP/DOWN and the enable terminal EN of the up/down counter 32 shown in FIG. 11. In the first embodiment of the present invention, the enable terminal EN and the up/down instruction terminal UP/DOWN of the up/down counter 32 receive the same information as those terminals of the up/down counter 31.

When the count value of the up/down counter 31 reaches +N as shown in FIG. 12(a), the count value of the up/down counter 32 is increased by +1. In the case shown in FIG. 12(b), the count value of the up/down counter 32 changes from +M'−1 to +M'. When the count value of the up/down counter 32 reaches +M, the up/down counter 32 generates the phase control pulse and the sign data indicating the phase control direction. Then, the count value of the up/down counter 33 increases by +1. In the case shown in FIG. 12(c), the count value of the up/down counter 33 changes from +2 to +3.

The decoder 34 receives the count value of the up/down counter 33, and generates a decoded output signal. More particularly, the decoder 34 operates in the accordance with the aforementioned Table 1 in the case of the second embodiment of the present invention. In the case shown in FIG. 12(c) and FIG. 12(d), the count value of the up/down counter 33 changes from +2 to +3, and the decoder output signal of the decoder 34 changes from +289 to +193. It will be noted that the count value of the up/down counter 33 corresponds to the frequency deviation. The decoder output signal is applied to an input terminal B of the comparator 36.

The counter 35 increments its count value in synchronism with the clock pulse signal applied to a clock terminal CK thereof. The count value of the counter 35 is applied to an input terminal A of the comparator 36.

The comparator 36 generates data indicating the phase control direction and a phase control pulse, when the count value of the counter 35 reaches the value output from the decoder 34. In the case shown in FIG. 12(d) and FIG. 12(e), the counter 35 is reset when the decoder output changes from +289 to +193, and starts to count the pulses from the output terminal Q of the up/down counter 33. When the count value (more precisely, the absolute value thereof) of the counter 35 reaches +289 as shown in FIG. 12(e), the phase comparator 36 outputs a phase control pulse via an output terminal ABS(A)=B and data indicating the phase control direction via an output terminal SIGN(A). The output signals generated via the output terminals ABS(A)=B and SIGN(A) form the periodic DPLL phase control pulse signal. In the case shown in FIG. 12(f), +1 is output from the comparator 36.

Figure 12:
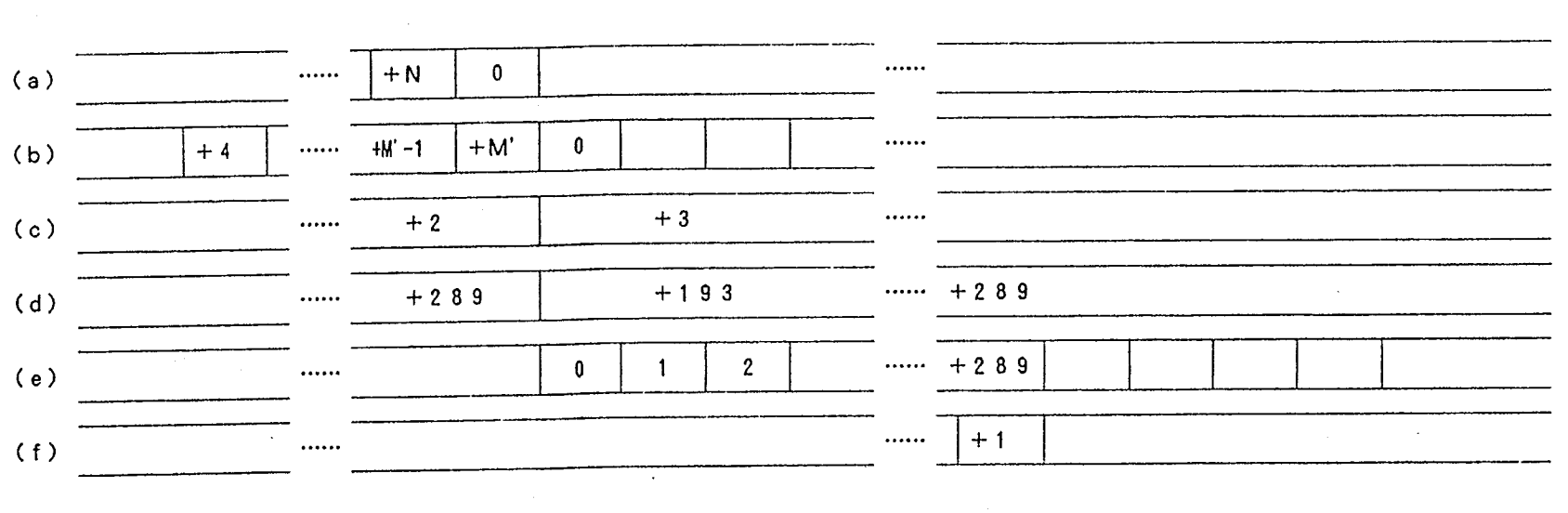
Figure 13:
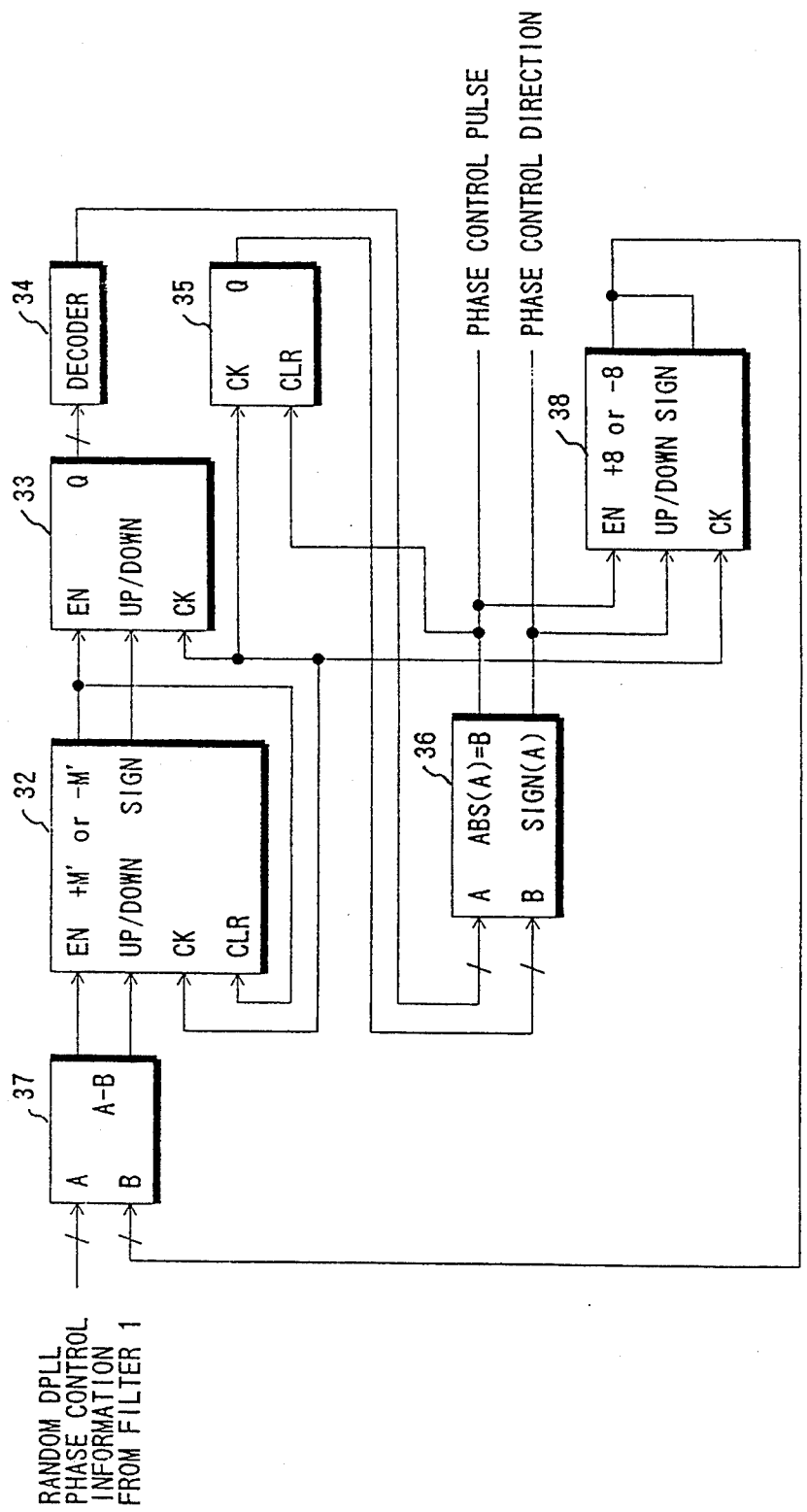
FIG. 13 is a block diagram of a constant-period loop filter used in the third embodiment of the present invention.

FIG. 13 is a block diagram of the constant-period loop filter 2 used in the third embodiment of the present invention. In FIG. 13, parts that are the same as parts shown in FIG. 12 are given the same reference numbers. As shown in FIGS. 12 and 13, a subtracter (adder) 37 and an up/down counter 38 are added to the structure shown in FIG. 12. The subtracter 37 corresponds to the adder 25 shown in FIG. 7, and the up/down counter 38 corresponds to the frequency divider 24.

The up/down counter 38 receives the phase control pulse (output from the comparator 38) via an enable terminal EN, and the phase control direction data (output from the comparator 38) via an up/down instruction terminal UP/DOWN. When the count value of the up/down counter 38 reaches +8 or −8, it generates a feedback pulse via an output terminal labeled +8 or −8, and data indicating the phase control direction via an output terminal SIGN. The signals of the up/down counter 38 indicating +1, −1 or 0 are applied to an input terminal B of the subtracter 37. The subtracter 37 also receives, via an input terminal A, the random DPLL control pulse signal from the random-period loop filter 1 shown in FIG. 7. The random DPLL control pulse signal indicates +1, −1 or 0. The subtracter 37 calculates A-B, and the result of the subtraction containing the pulse and the sign data is applied to the up/down counter 32.

Figure 14:
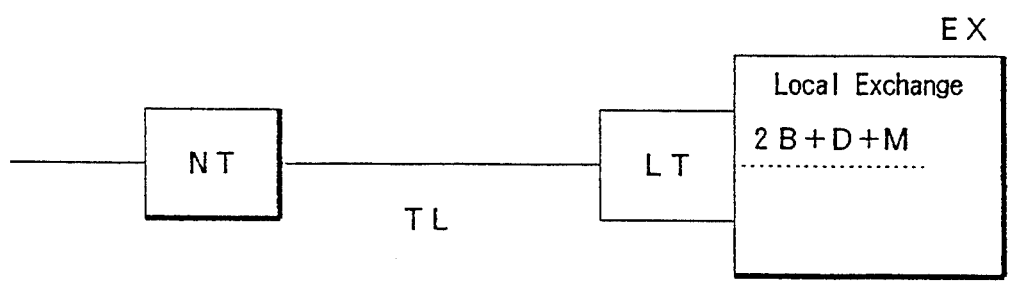
FIG. 14 is a block diagram of a communications system to which the present invention is applied.

The present invention is applicable to a communications system as shown in FIG. 14. The communications system shown in FIG. 14 is a digital subscriber line transmission system, which includes a network terminating unit NT, a line terminating unit LT and a local exchange EX. One or a plurality of terminals (not shown) are connected to the network terminating unit NT, which is located at the sides of the terminals and connected to the line terminating unit LT via a transmission line TL. Data can be transferred via the transmission line TL in both directions in accordance with, for example, an interface 2B+D+M (=2*64+16+4 kbps). The line terminating unit LT is accommodated in an exchange office in which the local exchange EX is also accommodated.

Figure 15:
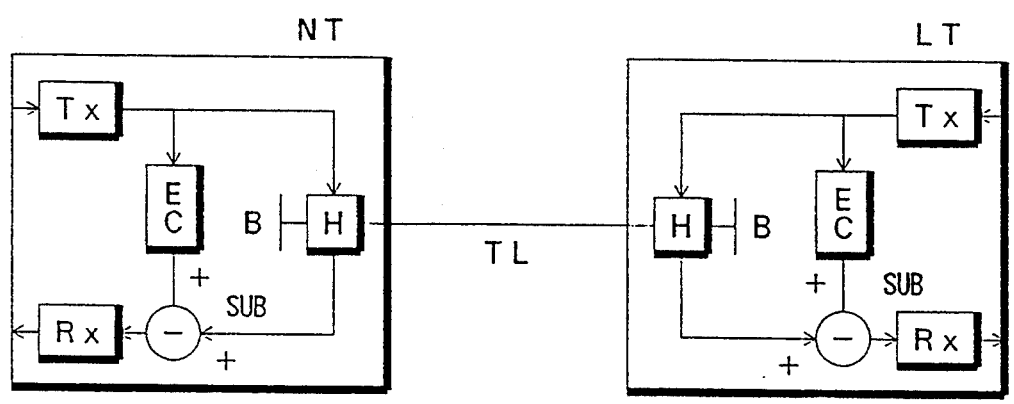
FIG. 15 is a block diagram of the communications system shown in FIG. 14 in more detail.

FIG. 15 shows the communications system shown in FIG. 14 in more detail. The network terminating unit NT includes a transmitter Tx, a receiver Rx, an echo canceller C, a subtracter SUB, a hybrid circuit H and a hybrid balance impedance B. The transmitter Tx receives data to be transmitted from an internal circuit (not shown) of the network terminator NT, and sends the data to the transmission line TL via the hybrid circuit H. The receiver Rx receives data from the transmission line TL via the hybrid circuit H, and sends the data to the internal circuit. The echo canceller EC generates an echo cancelling signal from the transmission data and outputs the echo cancelling signal to the subtracter SUB. The subtracter SUB subtracts the echo cancelling signal from the received signal including an echo component passing through the hybrid circuit H. The line terminating unit LT has the same structure as the network terminating unit NT, as shown in FIG. 15.

Figure 16:
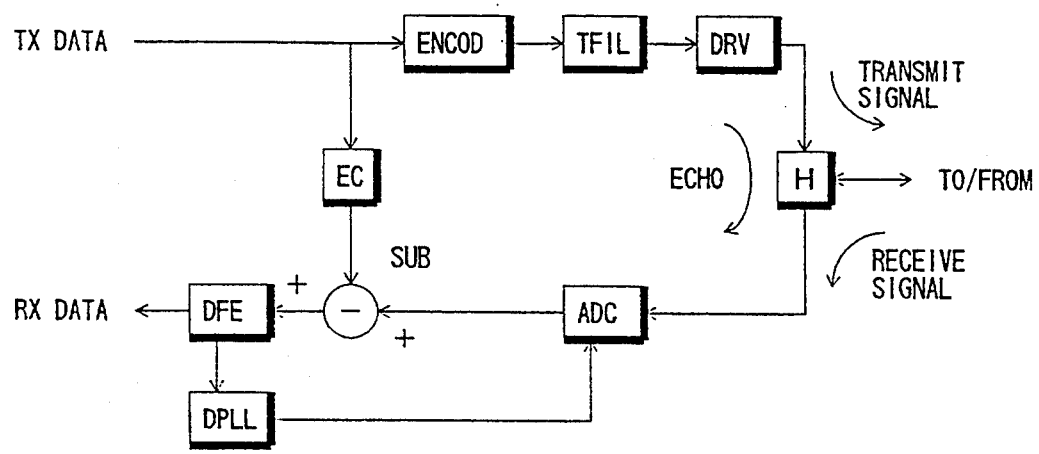
FIG. 16 is a block diagram of a network terminating unit shown in FIG. 15 in more detail.

FIG. 16 shows the network terminating unit NT shown in FIG. 15 in more detail. The transmission data from the transmitter Tx, such as speech data, is encoded by a 2B1Q encoder ENCOD. Coded data from the encoder ENCOD passes through a transmit filter TFIL and a driver DRV, and is sent to the transmission line TL via the hybrid circuit H. A decision feedback equalizer DEF, connected to the output terminal of the subtracter SUB, generates phase error information indicating the phase difference between the master clock signal for the network and the basic clock signal generated in the network terminating unit NT. The phase error information generated by the equalizer DEF is applied to the digital PLL circuit DPLL of the present invention. The digital PLL circuit DPLL generates the basic clock signal applied to an analog-to-digital converter ADC provided between the hybrid circuit H and the subtracter SUB. The sampling frequency of the A/D converter ADC is controlled by the phase control information from the digital loop filter provided in the digital PLL circuit DPLL.

Figure 17:
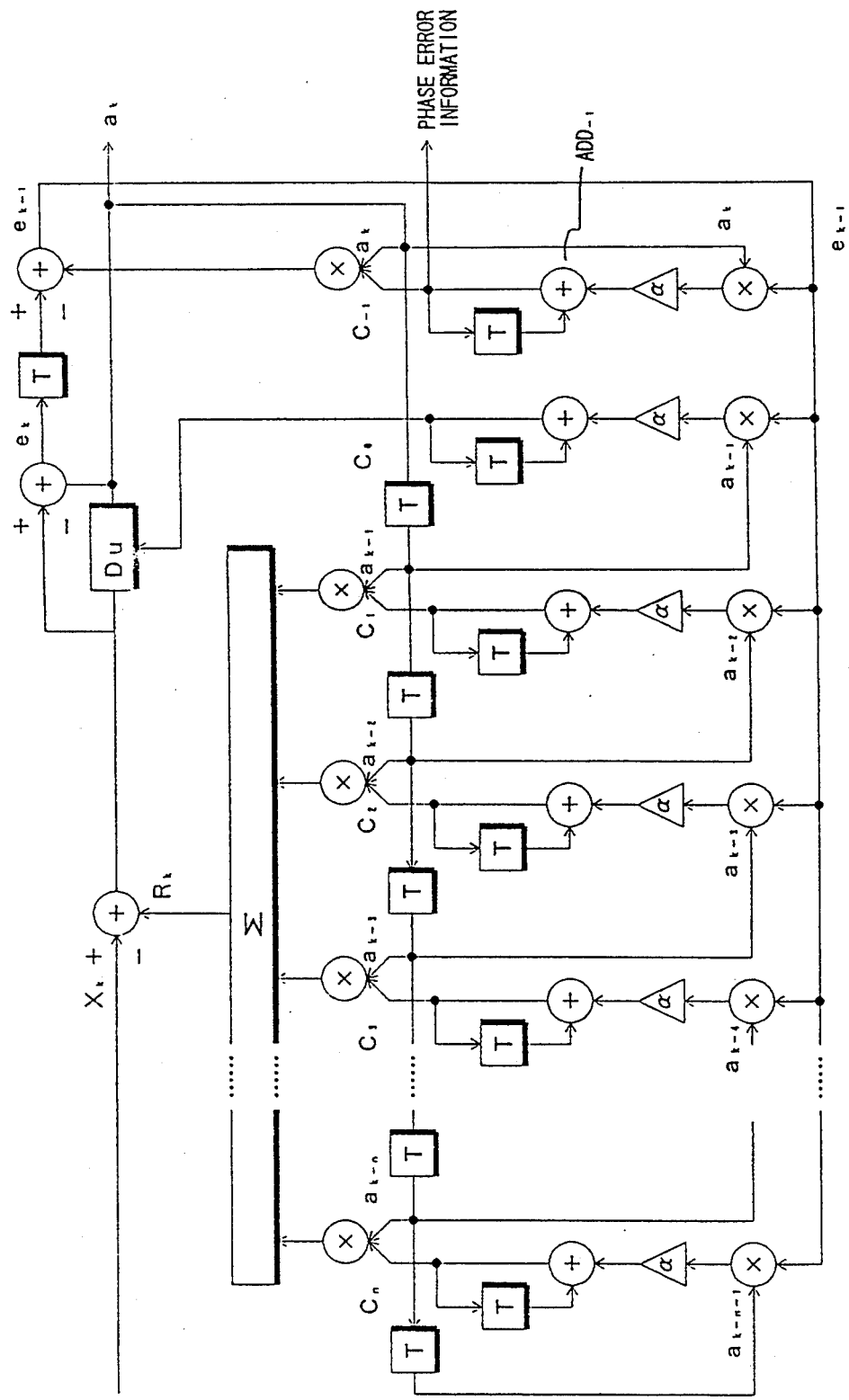
FIG. 17 is a block diagram of a decision feedback equalizer shown in FIG. 16.

FIG. 17 is a block diagram of the decision feedback equalizer DFE shown in FIG. 16. The decision feedback equalizer DFE includes a digital active filter, which has the function of cancelling intersymbol interference (post cursor components) $C_1$-$C_n$. The main signal component $C_0$ (main cursor component) of the received signal is used to decide the digital value of the received signal by means of a decision unit DU. The timing component $C_{-1}$ (pre-cursor component) of the received signal is used to regenerate timing information. The timing error information is obtained at the output terminal of an adder $ADD_{-1}$.

Figure 18:
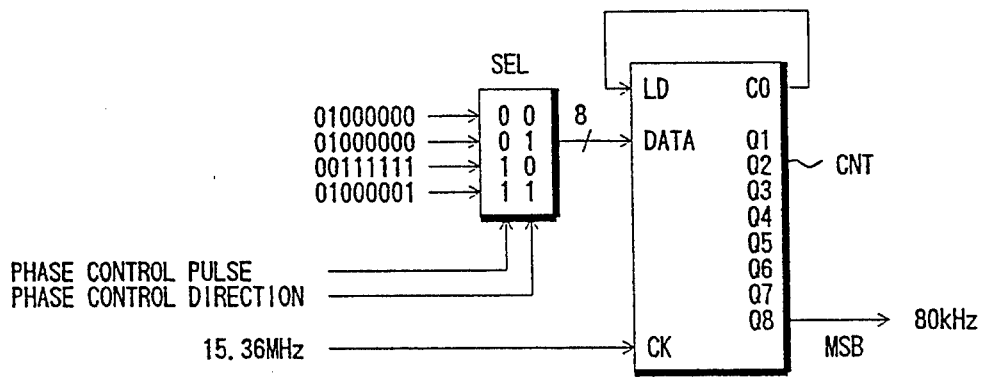
FIG. 18 is a block diagram of a frequency divider following the digital loop filter of the present invention.

FIG. 18 shows a frequency divider controlled by the digital loop filter of the present invention. The frequency divider following the digital loop filter of the present invention receives the phase control information from the digital loop filter, and generates the basic clock signal to be applied to the adder A/D converter ADC shown in FIG. 18. The frequency divider shown in FIG. 18 includes a selector SEL and an 8-bit counter CNT. The selector SEL selects one control data of four different control data in accordance with the phase control information from the digital loop filter. The phase control information from the digital loop filter contains the phase control pulse and the sign data indicating the phase control direction. The selected control data is applied to a data terminal DATA of the counter CNT, which receives, via a clock terminal CK, the 15.36 MHz master clock generated by the crystal oscillator (not shown in FIG. 18). The 80 kHz basic clock signal, which is the most significant bit MSB of the counter output, is output via an output terminal Q8 of the counter CNT by dividing the 15.36 MHz master clock signal generated by the crystal oscillator (not shown in FIG. 18). The control data from the selector SEL is used to adjust load data loaded via a load terminal LD of the counter CNT from a terminal CO thereof. When there is no need to control the phase of the basic clock signal, the load data indicates 64. When the phase should be advanced, the load data indicating 65 is used. When the phase should be delayed, the load data indicating 63 is used.

The present invention is not limited to the specifically disclosed embodiments, and variations and modifications may be made without departing from the scope of the present invention.

Figure 19:
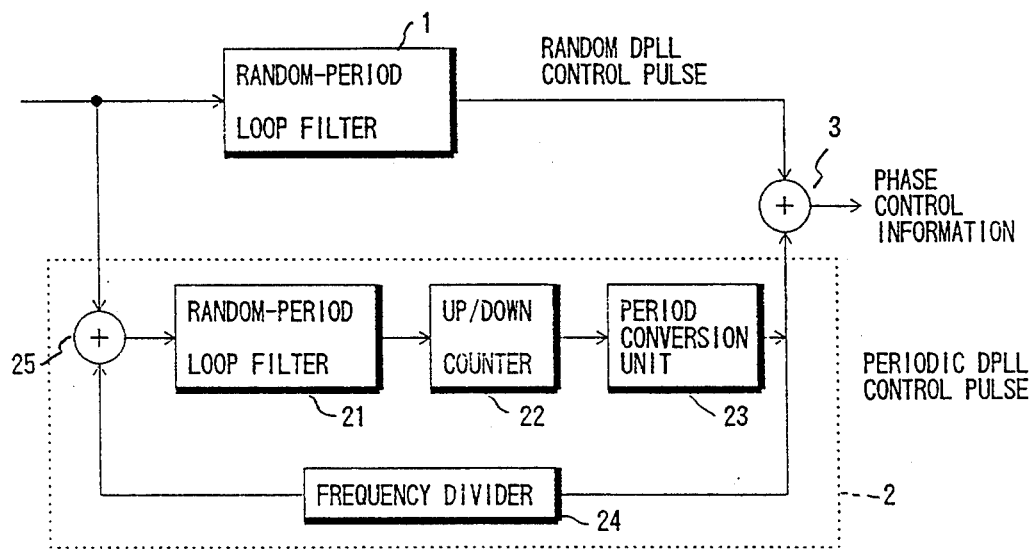
FIG. 19 is a block diagram of a variation of the first embodiment of the present invention.

For example, the frequency divider 24 can be applied to the structure shown in FIG. 5, as shown in FIG. 19. Further, the timer 26 shown in FIG. 8 can be applied to the embodiments of the present invention other than the fourth embodiment thereof. Furthermore, the hold circuit 4 shown in FIG. 7 can be applied to the embodiments of the present invention other than the third embodiment thereof.

What is claimed is:

1. A digital loop filter comprising:
first loop filter means for receiving a phase error information signal representing phase error information and obtained from comparison of a phase of a first signal with a phase of a second signal and for generating first phase control information at variable time intervals on the basis of said phase error information indicating a phase difference between said first signal and said second signal;
second loop filter means for receiving said phase error information and detecting a frequency deviation between the first and second signals from the phase error information and for generating second phase control information with a period inversely proportional to said frequency deviation; and
output means, coupled to said first and second loop filter means, for generating finalized phase control information obtained by adding the first phase control information and the second phase control information to each other.

2. The digital loop filter as claimed in claim 1, wherein:
the phase error information indicates one of three logic values +1, −1 and 0; and
said first loop filter means comprises means for accumulating the logic values indicated by the phase error information and for generating the first phase control information each time an accumulated result reaches ±N where N is an integer, and
wherein said second loop filter means comprises:
third loop filter means for accumulating the logic values indicated by the phase error information and for generating random control pulse information each time an accumulated result reaches ±M where M is an integer greater than N, the random control pulse information indicating a logic value of +1 or −1;
counter means, coupled to said third loop filter means, for accumulating logic values indicated by the random control pulse information from the third loop filter means and for generating an accumulated value corresponding to said frequency deviation; and
period conversion means, coupled to said counter means, for generating the second phase control information at the period inversely proportional to said accumulated value generated by said counter means.

3. The digital loop filter as claimed in claim 1, wherein:
the phase error information indicates one of three logic values +1, −1 and 0; and
said first loop filter means comprises means for accumulating the logic values indicated by the phase error information and for generating the first phase control information each time an accumulated result reaches ±N where N is an integer, the first phase control information indicating a logic value of +1 or −1, and
wherein said second loop filter means comprises:
third loop filter means for accumulating logic values indicated by the first phase control information from said first loop filter means and for generating random control pulse information each time an accumulated result reaches ±M' where M' is an integer so that ±(N+M)' is large enough to obtain said frequency deviation;
counter means, coupled to said third loop filter means, for accumulating logic values indicated by the random control pulse information from the third loop filter means and for generating an accumulated value corresponding to said frequency deviation; and
period conversion means, coupled to said counter means, for generating the second phase control information at the period inversely proportional to said accumulated value generated by said counter means.

4. The digital loop filter as claimed in claim 2, wherein said second loop filter means comprises:
frequency divider means, coupled between the period conversion means and said third loop filter means, for dividing a frequency of the second phase control information and for generating feedback information with a period longer than said period inversely proportional to said accumulated value generated by said counter means, said feedback information having a sign different from that of the second phase control information; and
adder means, coupled to said third loop filter means, said period conversion means and said frequency divider means, for adding the phase error information and the feedback information to each other and for applying an added result to said third loop filter means instead of the phase error information.

5. The digital loop filter as claimed in claim 3, wherein said second loop filter means comprises:
frequency divider means, coupled between the period conversion means and said third loop filter means, for dividing a frequency of the second phase control information and for generating feedback information with a period longer than said period inversely proportional to said count value, said feedback information having a sign different from that of the second phase control information; and
adder means, coupled to said third loop filter means, said period conversion means and said frequency divider means, for adding the random control pulse information and the feedback information to each other and for applying an added result to said third loop filter means instead of the random control pulse information.

6. The digital loop filter as claimed in claim 1, wherein:
the phase error information indicates one of three logic values $+1$, $-1$ and 0; and
said first loop filter means comprises means for accumulating the logic values indicated by the phase error information and for generating the first phase control information each time an accumulated result reaches $\pm N$ where N is an integer,
wherein said second loop filter means comprises:
counter means for accumulating the logic values indicated by the phase error information and for generating an accumulated result corresponding to said frequency deviation; and
period conversion means, coupled to said counter means, for generating the second phase control information at the period inversely proportional to said accumulated result generated by said counter means, and
wherein said second loop filter means comprises timer means for defining a predetermined time during which said counter means accumulates the logic values indicated by the phase error information.

7. The digital loop filter as claimed in claim 1, further comprising hold means, provided between the first loop filter means and the output means, for holding the first phase control information from the first loop filter means and for outputting the first phase control information at a time occurring between output times of adjacent pulses second phase control information.

8. The digital loop filter as claimed in claim 7, wherein said hold means holds the first phase control information so that adjacent pulses of the first and second phase control information are separated from each other by a predetermined time interval.

9. A digital PLL circuit comprising:
phase comparator means for comparing a phase of an input signal with a phase of an output signal and for generating phase error information indicating a phase difference between said input signal and said output signal;
a digital loop filter, coupled to said phase comparator means, generating finalized phase control information from the phase error information received from said phase comparator means;
oscillator means for generating an oscillation frequency; and
frequency divider means, coupled to said oscillator means and to said digital loop filter, for dividing the oscillation frequency received from said oscillator means in accordance with the finalized phase control information received from said digital loop filter and for generating the output signal,
said digital loop filter comprising:
first loop filter means for generating first phase control information at variable time intervals on the basis of the phase error information;
second loop filter means for detecting a frequency deviation between the input signal and the output signal from the phase error information and for generating second phase control information with a period inversely proportional to said frequency deviation; and
output means, coupled to said first and second loop filter means, for generating finalized phase control information obtained by adding the first phase control information and the second phase control information to each other.

10. The digital PLL circuit as claimed in claim 9, wherein:
the phase error information indicates one of three logic values $+1$, $-1$ and 0; and
said first loop filter means comprises means for accumulating the logic values indicated by the phase error information and for generating the first phase control information each time an accumulated result reaches $\pm N$ where N is an integer, and
wherein said second loop filter means comprises:
third loop filter means for accumulating the logic values indicated by the phase error information and for generating random control pulse information each time an accumulated result reaches $\pm M$ where M is an integer greater than N, the random control pulse information indicating a logic value of $+1$ or $-1$;
counter means, coupled to said third loop filter means, for accumulating logic values indicated by the random control pulse information from the third loop filter means and for generating an accumulated value corresponding to said frequency deviation; and
period conversion means, coupled to said counter means, for generating the second phase control information at the period inversely proportional to said accumulated value generated by said counter means.

11. The digital PLL circuit as claimed in claim 9, wherein:

the phase error information indicates one of three logic values +1, −1 or 0; and said first loop filter means comprises means for accumulating the logic values indicated by the phase error information and for generating the first phase control information each time an accumulated result reaches ±N where N is an integer, the first phase control information indicating a logic value of +1 or −1, and wherein said second loop filter means comprises:

third loop filter means for accumulating logic values indicated by the first phase control information from said first loop filter means and for generating random control pulse information each time an accumulated result reaches ±M′ where M′ is an integer so that ±(N+M′) is large enough to obtain said frequency deviation;

counter means, coupled to said third loop filter means, for accumulating logic values indicated by the random control pulse information from the third loop filter means and for generating an accumulated value corresponding to said frequency deviation; and period conversion means, coupled to said counter means, for generating the second phase control information at the period inversely proportional to said accumulated value generated by said counter means.

12. The digital PLL circuit as claimed in claim 10, wherein said second loop filter means comprises:

frequency divider means, coupled between the period conversion means and said third loop filter means, for dividing a frequency of the second phase control information and for generating feedback information with a period longer than said period inversely proportional to said accumulated value generated by said counter means, said feedback information having a sign different from that of the second phase control information; and adder means, coupled to said third loop filter means, said period conversion means and said frequency divider means, for adding the phase error information and the feedback information to each other and for applying an added result to said third loop filter means instead of the phase error information.

13. The digital PLL circuit as claimed in claim 11, wherein said second loop filter means comprises:

frequency divider means, coupled between the period conversion means and said third loop filter means, for dividing a frequency of the second phase control information and for generating feedback information with a period longer than said period inversely proportional to said count value, said feedback information having a sign different from that of the second phase control information; and adder means, coupled to said third loop filter means, said period conversion means and said frequency divider means, for adding the random control pulse information and the feedback information to each other and for applying an added result to said third loop filter means instead of the random control pulse information.

14. The digital PLL circuit as claimed in claim 9, wherein:

the phase error information indicates one of three logic values +1, −1 and 0; and said first loop filter means comprises means for accumulating the logic values indicated by the phase error information and for generating the first phase control information each time an accumulated result reaches ±N where N is an integer, wherein said second loop filter means comprises:

counter means for accumulating the logic values indicated by the phase error information and for generating an accumulated result corresponding to said frequency deviation; and period conversion means, coupled to said counter means, for generating the second phase control information at the period inversely proportional to said accumulated result generated by said counter means, and wherein said second loop filter means comprises timer means for defining a predetermined time during which said counter means accumulates the logic values indicated by the phase error information.

15. The digital PLL circuit as claimed in claim 9, further comprising hold means, provided between the first loop filter means and the output means, for holding the first phase control information from the first loop filter means and for outputting the first phase control information at a time occurring between output times of adjacent pulses of the second phase control information.

16. The digital PLL circuit as claimed in claim 15, wherein said hold means holds the first phase control information so that adjacent pulses of the first and second phase control information are separated from each other by a predetermined time interval.

* * * * *